(12) United States Patent
Barry

(10) Patent No.: US 12,073,872 B2
(45) Date of Patent: Aug. 27, 2024

(54) APPARATUSES AND METHODS FOR ADDRESS BASED MEMORY PERFORMANCE

(71) Applicant: MICRON TECHNOLOGY, INC., Boise, ID (US)

(72) Inventor: Beau D. Barry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 17/186,797

(22) Filed: Feb. 26, 2021

(65) Prior Publication Data

US 2021/0272620 A1   Sep. 2, 2021

Related U.S. Application Data

(60) Provisional application No. 62/982,598, filed on Feb. 27, 2020.

(51) Int. Cl.
  *G11C 11/4093* (2006.01)
  *G11C 11/408* (2006.01)
  (Continued)

(52) U.S. Cl.
  CPC ...... *G11C 11/4093* (2013.01); *G11C 11/4087* (2013.01); *G11C 11/4091* (2013.01); *G11C 11/4097* (2013.01)

(58) Field of Classification Search
  CPC ............ G11C 11/4093; G11C 11/4087; G11C 11/4091; G11C 11/4097
  (Continued)

(56) References Cited

U.S. PATENT DOCUMENTS 8,885,416 B2   11/2014   Mui et al.
9,805,786 B1   10/2017   Saito et al.
(Continued)

FOREIGN PATENT DOCUMENTS

WO   2014062543 A2   4/2014
WO   2021173943 A1   9/2021
WO   2022108752 A1   5/2022

OTHER PUBLICATIONS

U.S. Appl. No. 16/953,214 titled "Apparatuses and Methods for Faster Memory Access Regions", filed Nov. 19, 2020.
(Continued)

*Primary Examiner* — Anthan Tran
(74) *Attorney, Agent, or Firm* — Dorsey & Whitney LLP

(57) ABSTRACT

Apparatuses, systems, and methods for address based memory performance. A memory array may include a first performance region and a second performance region, each of which may have different performance characteristics from each other. The second region may be distinguished from the first region based on the addresses which are associated with each region. The second performance region may have different performance characteristics based on differences in the layout, components, logic circuits, and combinations thereof. For example, the second region, compared to the first region, may have reduced difference to the data terminals, reduced length of digit lines, a different type of sense amplifier, different refresh address tracking, and combinations thereof. The controller may perform access operations on the memory with different timing based on which region of the memory is accessed.

8 Claims, 13 Drawing Sheets

(51) Int. Cl.
*G11C 11/4091* (2006.01)
*G11C 11/4097* (2006.01)

(58) Field of Classification Search
USPC .......................................................... 365/149
See application file for complete search history.

(56) References Cited

U.S. PATENT DOCUMENTS

| | | | |
|---|---|---|---|
| 10,248,592 | B2 | 4/2019 | Mirichigni et al. |
| 10,366,743 | B1 | 7/2019 | Ho et al. |
| 10,372,330 | B1 | 8/2019 | Gans et al. |
| 2004/0179418 | A1* | 9/2004 | Hwang ................ G11C 7/1006 365/230.03 |
| 2005/0226061 | A1 | 10/2005 | Park |
| 2008/0002478 | A1 | 1/2008 | Park |
| 2009/0129188 | A1* | 5/2009 | Kim ......................... G11C 7/08 365/207 |
| 2009/0244988 | A1 | 10/2009 | Ashizawa |
| 2010/0177584 | A1 | 7/2010 | Lee et al. |
| 2010/0325375 | A1 | 12/2010 | Ueno et al. |
| 2011/0205828 | A1 | 8/2011 | Richter et al. |
| 2012/0057413 | A1 | 3/2012 | Yun et al. |
| 2013/0227229 | A1 | 8/2013 | Ishikawa |
| 2014/0204660 | A1 | 7/2014 | Chandwani et al. |
| 2016/0372166 | A1 | 12/2016 | Lym |
| 2017/0287547 | A1* | 10/2017 | Ito ....................... G11C 11/4087 |
| 2018/0239531 | A1 | 8/2018 | Lea |
| 2019/0385667 | A1 | 12/2019 | Morohashi et al. |
| 2022/0157372 | A1 | 5/2022 | He et al. |

OTHER PUBLICATIONS

Kim, Suk Min et al., "Sensing Margin Enhancement Technique Utilizing Boosted Reference Voltage for Low-Voltage and High-Density DRAM", IEEE Transactions on Very Large Scale Integration (VLSI) Systems, vol. 27, No. 10, Oct. 2019, pp. 2413-2422.
PCT Application PCT/US21/57756 titled "Apparatuses and Methods for Faster Memory Access Regions", filed Nov. 2, 2021.
International Search Report and Written Opinion for PCT Application No. PCT/US2021/019833, mailed Jun. 22, 2021.
PCT Patent Application PCT/US21/19833 titled "Apparatuses and Methods for Address Based Memory Performance", filed Feb. 26, 2021.

* cited by examiner

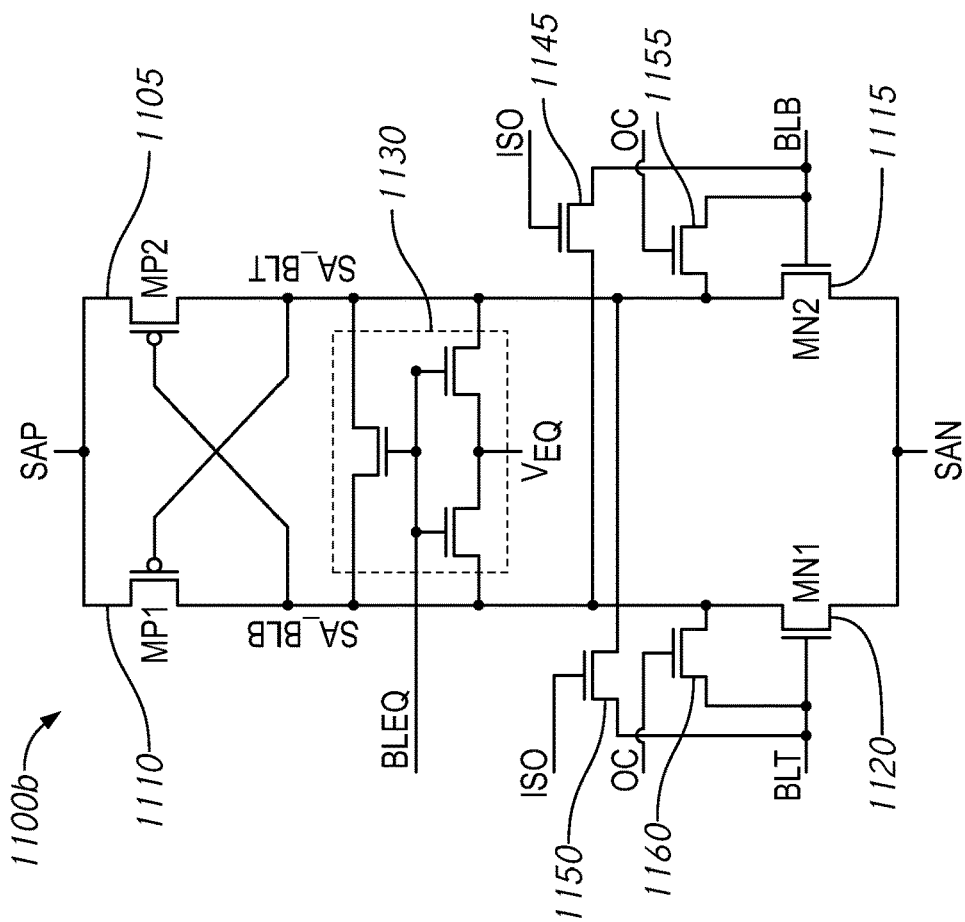
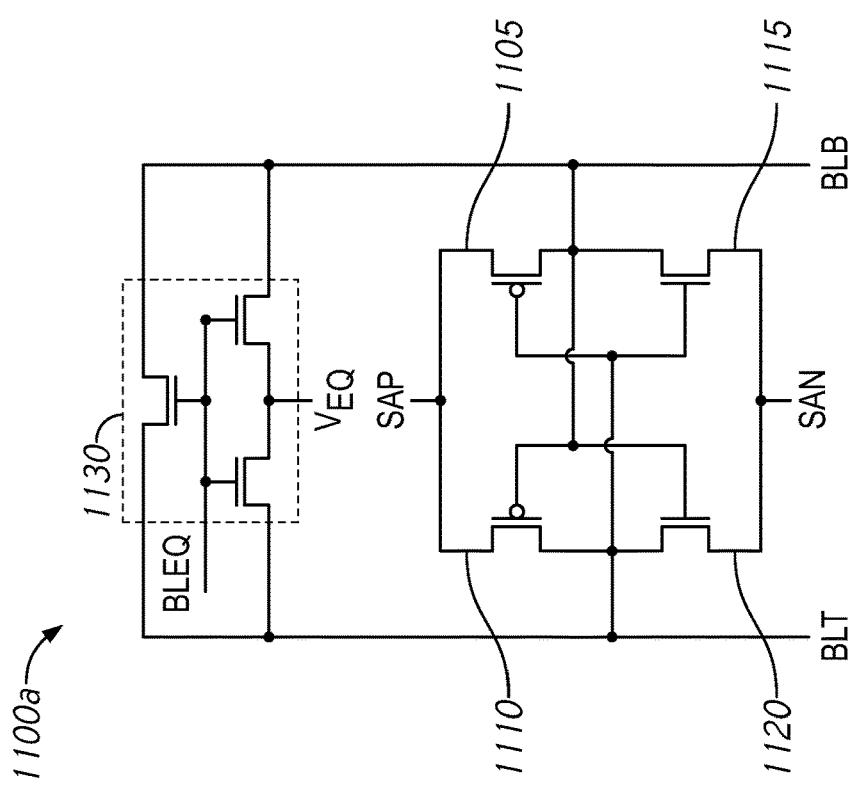
FIG. 11B
FIG. 11A

APPARATUSES AND METHODS FOR ADDRESS BASED MEMORY PERFORMANCE

CROSS-REFERENCE TO RELATED APPLICATION(S)

This application claims the benefit under 35 U.S.C. § 119 of the earlier filing date of U.S. Provisional Application Ser. No. 62/982,598 filed Feb. 27, 2020, the entire contents of which are hereby incorporated by reference in their entirety for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). A memory device may have various performance characteristics for writing information to a memory cell and/or reading information from a memory cell. For example, a time required to read/write, a reliability of information stored in a memory cell, power consumption to read/write etc. There may be various trade-offs involved in improving the performance of a memory. For example, reducing read/write times may involve increasing a cost of the memory.

BRIEF DESCRIPTION OF THE DRAWINGS

FIGS. 11A-11B are schematic diagrams of sense amplifiers according to some embodiments of the present disclosure.

DETAILED DESCRIPTION

Figure 1:
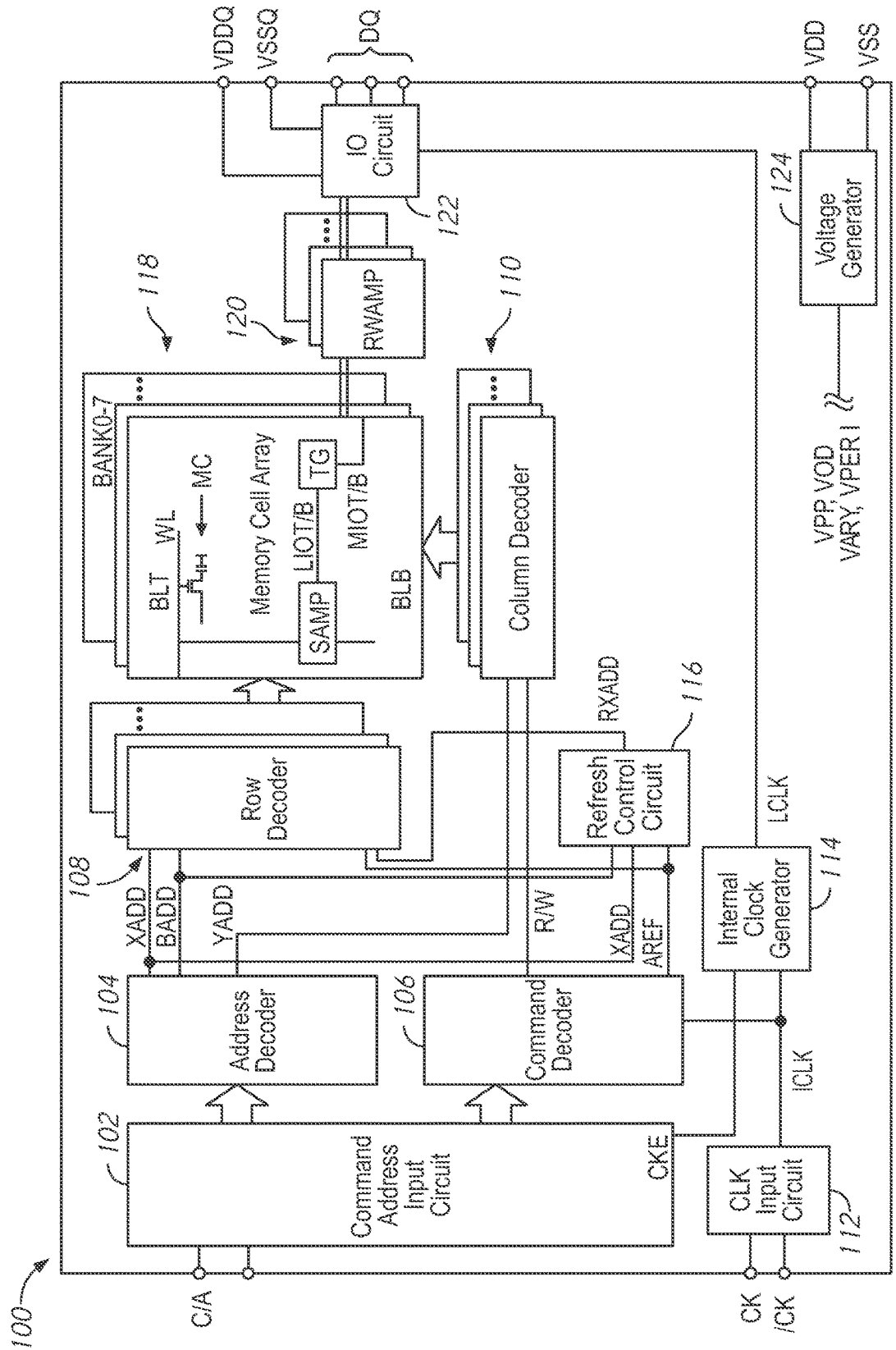
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory devices may include a memory array which includes a number of memory cells, each of which may store information. For example, each memory cell may store a single bit of information. The memory cells may be located at the intersections of word lines (rows) and digit lines (bit lines/columns). Each word line may be associated with a row address, and each digit line may be associated with a column address. Accordingly, memory cells may be specified by their row and column addresses.

A memory device may have certain performance characteristics for access operations on the memory cells of the device. For example, characteristics may include a time it takes to write information to a given memory cell, the time it takes to read information from a given memory cell, reliability of information read from a memory cell, power consumed while writing or reading information, etc. A device including a memory array may have specified characteristics, which may be based, in part, on the lowest performance characteristics of a memory cell in the array. For example, if it takes longer to write/read data to some memory cells than others, then the overall performance of the memory may be based on the memory cell with the slowest read/write times such that the overall performance specification is based on a maximum time it takes for an access operation to any memory cell of the array. While increased performance characteristics are generally desirable, it may be impractical (e.g., too costly) to improve the performance of all of the memory cells of a memory device in order to improve the overall performance of the entire device.

The present disclosure is drawn to apparatuses, systems, and methods for address based memory performance. A memory device may have a first group of memory cells with a first set of performance characteristics and a second group of memory cells with a second set of performance characteristics. For example, the first and second groups of memory cells may be regions of memory cells within a memory bank. The first and second groups of memory cells may be identified by the memory based on the addresses (e.g., the row and column addresses) associated with the memory cells in that group. A controller may perform access operations by providing a row and column address (along with other commands, data to be written etc.) based on the different performance characteristics of the different groups of memory cells. The different performance characteristics of the groups of memory cells may be due to the geometry of the memory cells in the array, one or more structural differences between the regions of the memory array, differences in the logic circuits used to manage data in the memory array, differences in the way the controller manages different regions of the memory array, and combinations thereof.

For example, if the second group of memory cells has a reduced read latency compared to the first group of memory cells, then the controller may issue a read command and may expect data at a data terminal of memory in a different time based on whether the read command was directed to memory cells of the first or second group.

For example, if the first group of memory cells have increased reliability compared to the second group of memory cells, then the controller may identify data with different levels of sensitivity (e.g., security, criticality, etc.) and may store the more sensitive information in the first group of memory cells rather than the second group of memory cells.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BLT and BLB, and a plurality of memory cells MC arranged at intersections of the plurality of word lines WL and the plurality of bit lines BLT and BLB. The selection of the word line WL is performed by a row decoder 108 and the selection of the bit lines BLT and BLB is performed by a column decoder 110. In the embodiment of FIG. 1, the row decoder 108 includes a respective row decoder for each memory bank and the column decoder 110 includes a respective column decoder for each memory bank. The bit lines BLT and BLB are coupled to a respective sense amplifier (SAMP). Read data from the bit line BLT or BLB is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BLT or BLB.

The semiconductor device 100 may employ a plurality of external terminals, such as solder pads, that include command and address (C/A) terminals coupled to a command and address bus to receive commands and addresses, and a CS signal, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
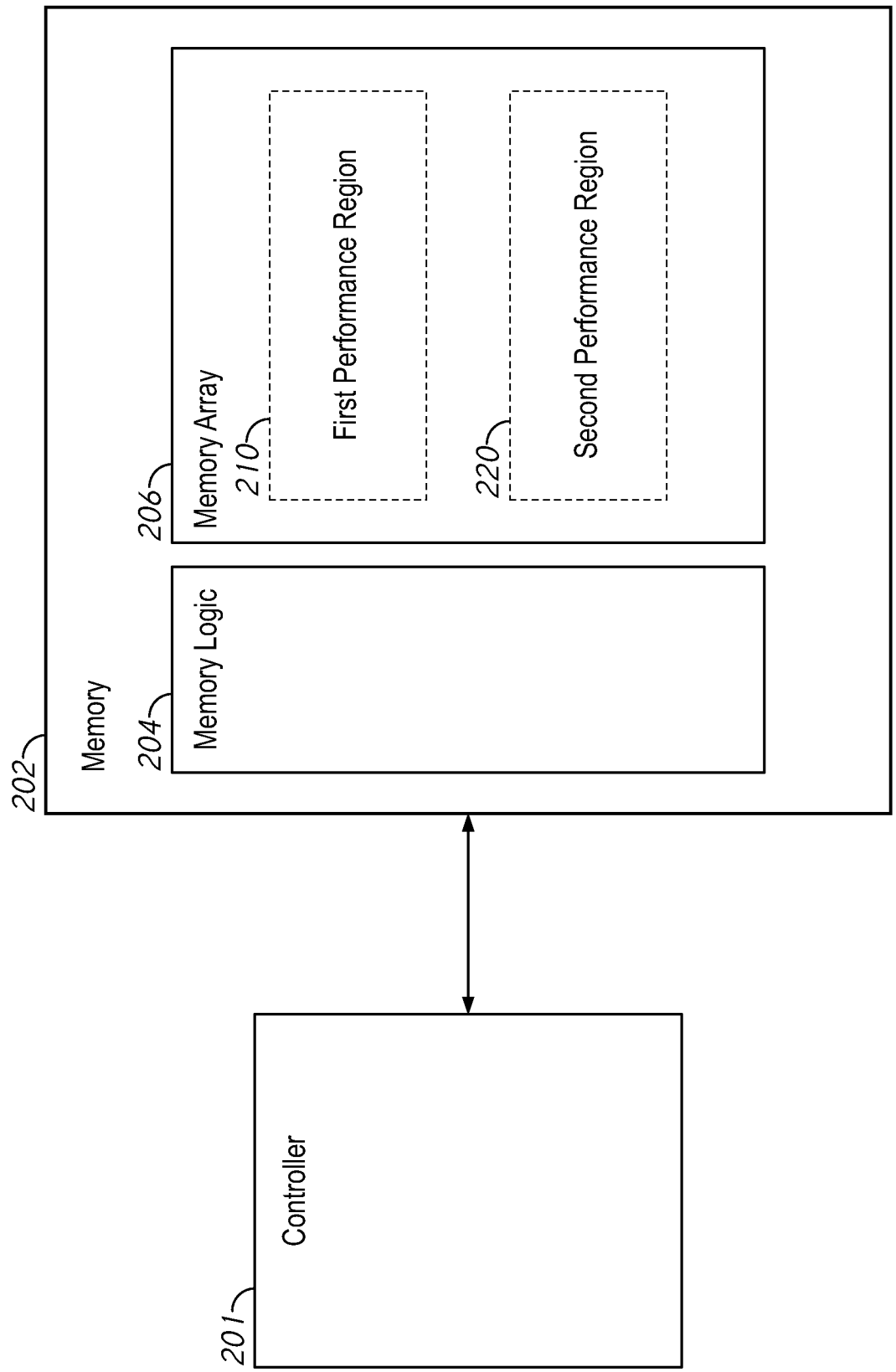
FIG. 2 is a block diagram of a memory system according to some embodiments of the present disclosure.

FIG. 2 is a block diagram of a memory system according to some embodiments of the present disclosure. The memory system includes a controller 201 and a memory device 202. The memory device 202 may, in some embodiments, be included in the memory device 100 of FIG. 1. The memory device 202 may represent a simplified view of a memory device, and various components such as those shown in FIG. 1 may not be shown again or discussed in regards to FIG. 2.

The memory device 202 includes memory logic 204, which may be used to process commands received from the controller and/or perform various operations (such as refreshing) on the memory array 206. For example, the memory logic 204 may include components such as a refresh control circuit (e.g., 116 of FIG. 1), row and column decoder (e.g., 108/110 of FIG. 1), and/or command and address input circuits/decoders (e.g., 102, 104, and 106 of FIG. 1). The memory array 206 includes a first performance region 210 and a second performance region 220. In some embodiments, the first performance region 210 and the second performance region 220 may both be regions of the same memory bank. In some embodiments, each bank of the memory array 206 may have a first region 210 and a second region 220. In some embodiments, only some of the banks of the memory array 206 may be differentiated into different performance regions.

The first performance region 210 and the second performance region 220 may each include one or more memory cells. For example, the first performance region 210 may include a number of word lines and a number of digit lines, with a number of memory cells at the intersections thereof. The second performance region 220 may also include a number of word lines and digit lines with memory cells at the intersections thereof. Since the each word line is associated with a row address and each digit line is associated with a column address, the controller 202 and/or the memory logic 204 may determine which memory cells are in the first region 210 or the second region 220 based on the addresses associated with those regions. The memory regions 210 and 220 may represent physical address spaces of the memory array 206 (e.g., a first physical address space and a second physical address space). The physical address spaces may represent regions of the memory array 206 may be groups of memory cells which are distinguished by one or more particular address(es).

In some embodiments, a word line and/or digit line may extend across the performance regions. For example, the first performance region 210 may include word lines WL0 to WLi, while the second performance region 220 includes word lines W Li+1 to WLj, and digit lines may be shared in common between the regions (e.g., digit lines DL0 to DLk may each intersect word lines WL0 to WLj). The row address may thus determine whether a specified memory cell is in the first region 210 or the second region 220. Other embodiments may use the column address to specify the regions, or may use a mix of row and column addresses to distinguish the regions. In some embodiments, one or both of the regions 210/220 may be discontiguous. For example, wordlines WL0 to WLi and wordlines WLj+1 to WLk may be part of the first region 210 while wordlines WLi+1 to WLj may be part of the second region 220.

The first performance region 210 and the second performance region 220 may have different performance characteristics. The performance characteristics may determine one or more properties of the operation of the memory, such as the speed at which data is written to/read from memory cells, the power consumed by writing/reading, the reliability of information stored in the memory cells of that region, etc. For example, the second performance region 220 may have a shorter read latency than the first performance region 210. Accordingly, when the controller 201 provides a read command to the second performance region 220, the data may be provided to the controller 201 in a shorter amount of time than when the controller 201 provides a read command to the first performance region 210. Accordingly, the controller 201 may, in some embodiments preferentially store information in the second performance region 220.

In some embodiments, the two performance regions 210 and 220 may have different performance characteristics based, at least in part, on the manner in which the regions are operated. For example, the second region 220 may include memory cells which have a reduced read latency compared to memory cells of the first region 210. In an example read operation, the memory controller 201 may issue a read command to an address which specifies memory cells in the first region 210 and may expect data at the data terminals (e.g., at the interface connection couplable to one of the DQ pads) after a first number of clock signals, where the first number is based on the latency of the first region. The memory controller 201 may issue a read command to an address which specifies memory cells in the second region 220 and may expect data at the data terminals after a second number of clock cycles based on the latency of the second region, where the second number is less than the first number. In this manner, access operations may occur faster in the second region 220 than in the first 210.

In some embodiments, the two performance regions 210/220 may have different performance characteristics due to one or more structural differences between the two performance regions. For example, the first performance region 210 may include circuit components (e.g., sense amplifiers) of a first type, while the second performance region 220 may include circuit components of a second type. The different types may, for example, draw different amounts of power, and accordingly, operations in the second region 220 may draw less power than the first region.

The controller 201 and/or the memory logic 204 may handle information stored in the memory 202 in a manner which utilizes the performance differences between the regions 210 and 220. In some embodiments, the controller 201 may include information about which addresses are associated with which regions of the memory array 206. In some embodiments, the memory 202 may include a storage area (e.g., a mode register) which includes information about the different memory regions, and the controller 201 may retrieve the information from the memory 202. When the controller 201 writes data to the memory 202, it may use various criteria to determine whether the data is to be stored in the first region 210 or the second region 220. In some embodiments, the controller 201 may preferentially store information in the second performance region 220 whenever sufficient space is available in the second region 220.

In some embodiments, the controller 201 may use one or more criteria to classify data to be written to the memory 202, and then may store data in the first or the second region based on that classification. For example, if the second region 220 has increased reliability (e.g., a lower bit failure rate) compared to the first region 210, then the controller 201 may identify more sensitive information and store the more sensitive information in the second region 220.

Although only two performance regions 210 and 220 are shown, it should be understood that a greater number of different performance regions may be used in other embodiments, For example, three performance regions may be used, with a first region with first characteristics, a second region with second characteristics, and a third region with third characteristics. Although the two performance regions 210 and 220 are shown as being contiguous, it should be understood that the different performance regions may include multiple portions arranged across the memory, and that different portions of a performance region may have other performance regions in between.

Figure 3:
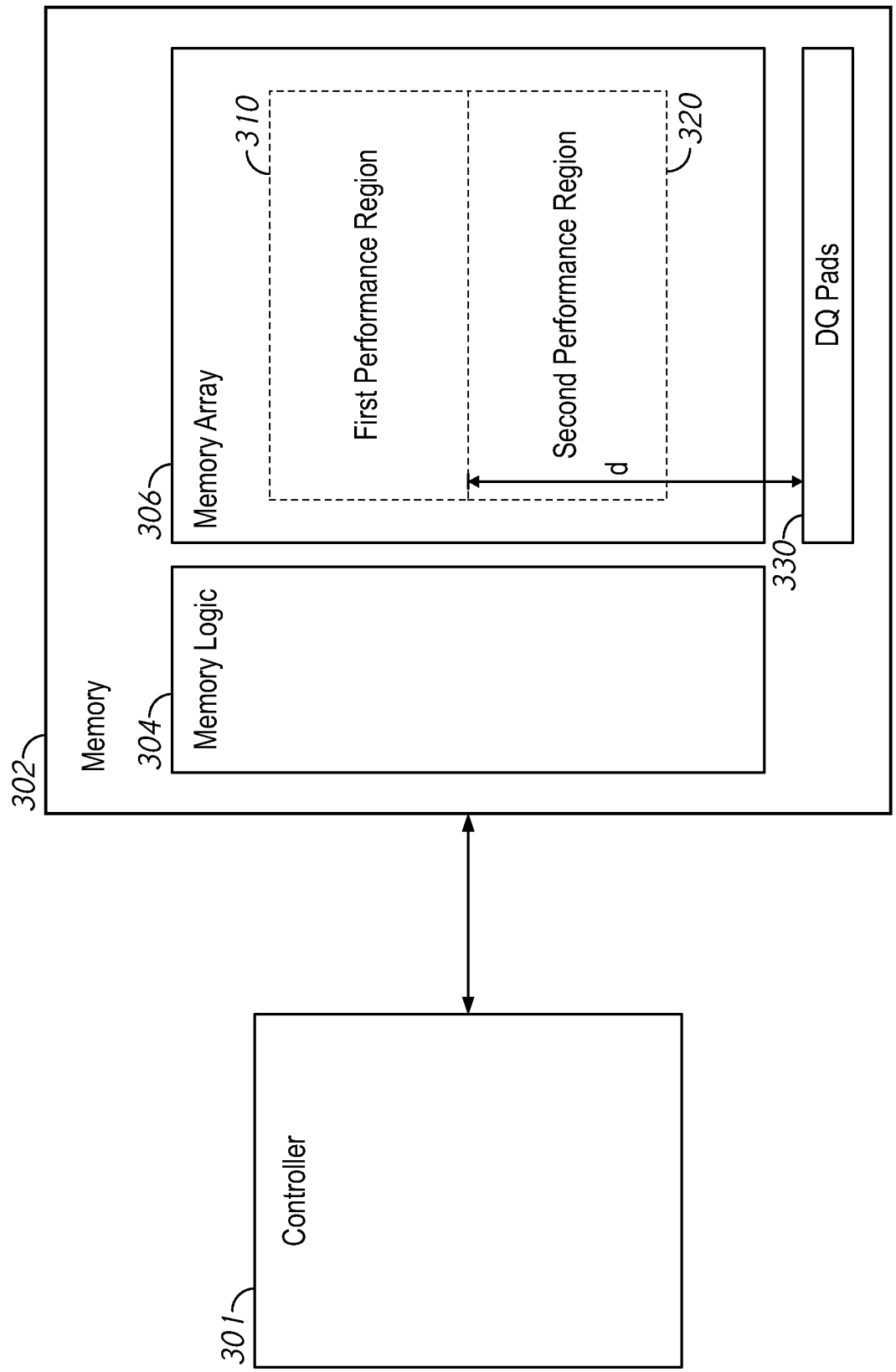
FIG. 3 is a block diagram of a memory system with different performance regions based on a distance to DQ terminals according to some embodiments of the present disclosure.

FIG. 3 is a block diagram of a memory system with different performance regions based on a distance to DQ terminals according to some embodiments of the present disclosure. The memory system of FIG. 3 includes a controller 301 and memory 302. The memory 302 may, in some embodiments, be included in the memory 202 of FIG. 2. The memory 302 and controller 301 may generally be similar to the memory 202 and controller 201 of FIG. 2, and for the sake of brevity, features described with respect to FIG. 2 will not be repeated with respect to FIG. 3.

The memory 302 includes a second region 320 which includes memory cells which are within a certain distance d of the data terminals (e.g., the interface connections couplable to the DQ pads) 330 and a first region 310 which includes memory cells which are greater than the distance d from the DQ pads 330. Due to the reduced distance that signals have to travel between the DQ pads 330 and the memory cells of the second memory region 320 compared to the first memory region 310, the memory cells of the second memory region 320 may have reduced latency compared to the memory cells of the first memory region 310. Accordingly, when the controller 301 issues read commands to the second region 320, it may receive data from the DQ pads 330 after fewer clock cycles than when the controller 301 issues read commands to the first region 310.

Figure 4:
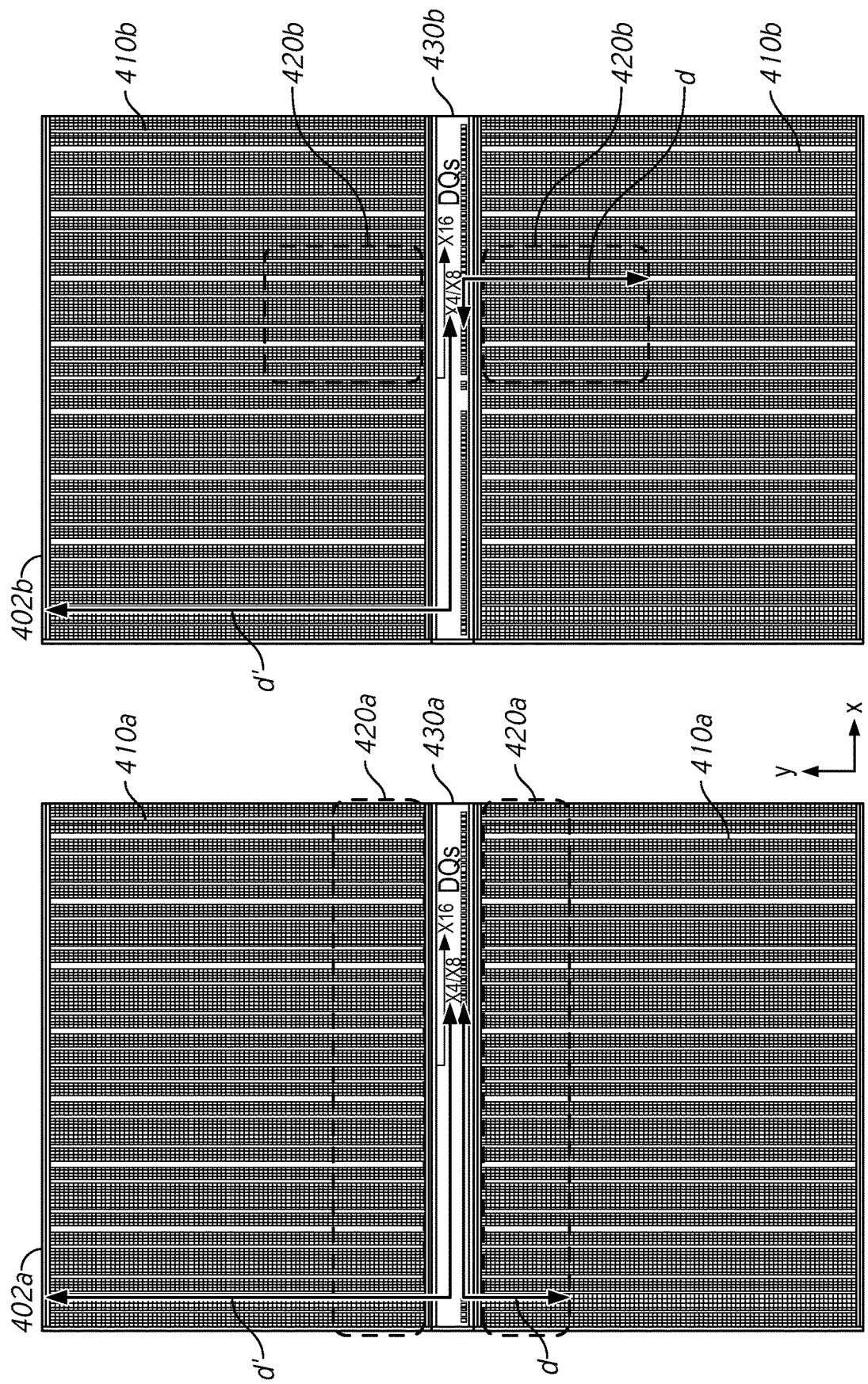
FIGS. 4A-4B are a schematic diagram of a memory system with different performance regions based on a distance to DQ terminals according to some embodiments of the present disclosure.

FIGS. 4A-4B are a schematic diagram of a memory system with different performance regions based on a distance to DQ terminals according to some embodiments of the present disclosure. The memories 402a and/or 402b may, in some embodiments, be included in the memory 302 of FIG. 3. The memory 402a shows a first example where the distance d is based, at least in part, on a number of word lines from the DQ terminals 430a. The memory 402b shows an example the distance d is based, at least in part, on both a number of word lines and a number of digit lines from the DQ terminals 430b.

The memory 402a shows an example layout of a memory array 402a, such as a memory bank. The memory 402a may be divided into a first section and a second section, with a region including various terminals, such as the DQ terminals 430a, in between. The memory array 402a may have rows which generally extend along the x-axis, and columns which extend along the y-axis. The memory 402a shows second region 420a (e.g., second region 320 of FIG. 3), which has a first portion on a first side of the DQ pads 430a (e.g., a first section of the memory 402a) and a second portion on the opposite side of the DQ pads 430a (e.g., a second section of the memory 402a). The remainder of the memory cells of the memory array 402a (e.g., the memory cells which are outside of the second region 420a) may be part of a first region (e.g., the first region 310 of FIG. 3).

The memory 402a includes an arrow d, which represents a maximum physical distance a signal may need to travel between the DQ pads 430a and memory cell of the second region 420a. The memory 402a also includes an arrow d', which represents a maximum physical distance a signal may need to travel between the DQ pads 430a and a memory cell which is in the first region. The distance d is shorter than the distance d'. The arrows d and d' may represent a simplified view of signal paths through the memory, in some embodiments, the arrows d and d' may follow more complicated paths.

Accordingly, since the distance d is less than the distance d', and since some performance characteristics may be based on a length of the signal path, the memory cells of the first region 420a may have different performance characteristics than the memory cells of the first region 410a. For example, the latency of a given section may be based on the distances d and d'. Since it may be important to ensure that data may be retrieved from any memory cell of the region, the latency of the region may be based, in part, on the time it takes for signals to travel to/from the memory cells which are the furthest from the DQ pads 430a. Thus a controller may treat the memory cells of the second region 420a as having a reduced latency compared to the memory cells of the first region 410a. For example, the power consumed by access operations may be based, in part, on a resistance of components along the signal path. Accordingly, access operations in the second region 420a may require less power than access operations in the first region 410a. For example, the reliability of data may be based, in part, on the distance signals travel, and so data received from the second region 420a may have increased reliability (e.g., lower bit failure rate) compared to the first region 410a.

In the memory 402a, the memory cells of the first region 420a are defined by a number of rows away from the DQ pads 430a. For example, the first region 420a may include wordlines which are within +N and −N of the DQ pads 430a, where N is a number of word lines.

The memory 402b may be generally similar to the 402b, and for the sake of brevity features already described with respect to the memory 402a will not be repeated with respect to the memory 402b. In the memory 402b, the second region 420b may be defined by a number of rows and a number of columns away from the DQ pads 430b. For example, the second region 420b may include wordlines which are within +M and −M of the DQ pads 430b and digit lines which are within +L and −L of the DQ pads 430b. The second region 420b may off improved performance characteristics compared to the first region, similar to one or more of the performance characteristics described in regards to FIG. 4A.

Figure 5:
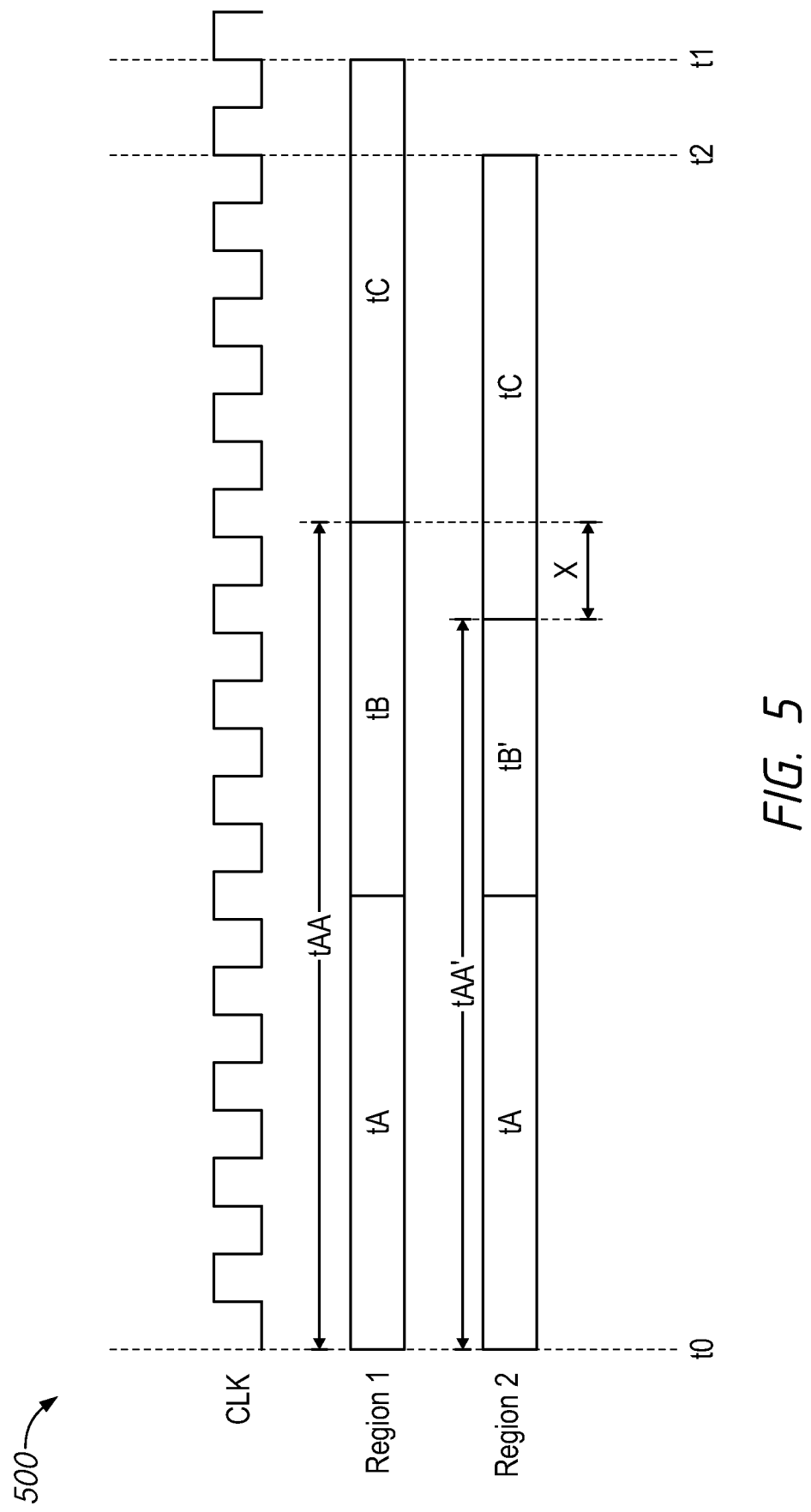
FIG. 5 is a timing diagram of an example read operation of a memory according to some embodiments of the present disclosure.

FIG. 5 is a timing diagram of an example read operation of a memory according to some embodiments of the present disclosure. The timing diagram 500 may represent the operation of a memory such as the memory 100 of FIG. 1, 202 of FIG. 2, 302 of FIG. 3, 402a of FIG. 4A and/or 402b of FIG. 4B. The timing diagram 500 may represent a portion of a read operation. The first line of the timing diagram 500 is a clock signal CLK, which may be a periodic signal used to control timing of various operations in the memory. The second trace represents the operations of a first performance region of the memory, while the third trace represents the operations of a second performance region of the memory. The second performance region may have a reduced read latency compared to the first performance region. For example, the second performance region may represent a group of memory cells which are within a maximum signal path distance d of the data terminals, while the first performance region represents memory cells which are within a maximum signal path distance d' of the data terminals, where d' is greater than d.

At an initial time t0, an internal read command is issued by the memory (e.g., in response to a read command issued by a controller). The line for 'Region 1' indicates an example operation where the read command was issued by the controller along with an address which is part of the first performance region, while the line for 'Region 2' indicates an example operation where the read command was issued along with an address which is part of the second performance region. After the read command is issued, the memory may perform various operations (e.g., during a time tRCD) which results in an internal read command being issued at a time t0. In both cases (e.g., an address associated with each memory region) after the time t0, an amount of time tA passes, which represents the time between the internal read command being issued to the column select signal being fired. The time tA may represent the transfer of information from the specified memory cell(s) along their associated digit lines to their associated local I/O lines (e.g., LIOT/B of FIG. 1). The time tA may be the same for both region 1 and region 2, as the timing may not be significantly affected by a distance to the DQ pads.

After the time tA has passed, the first region performs operations which take a time tB, while the second region performs operations which take a time tB'. The operations performed during tB and tB' represent the parallel information transfer from the local I/O lines to the output buffer (e.g., to I/O circuit 122 of FIG. 1). The time tB is greater than the time tB', because the accessed memory cells in the second region are closer to the DQ pads and I/O circuit than the accessed memory cells in the first region. The times tA and tB in the first region may represent a time tAA, while the times tA and tB' in the second region represent a time tAA'. The time tAA' may be shorter than the time tAA. In particular, the time tAA' may be X nanoseconds shorter than the time tAA. In some embodiments, X may be 1 to 3 nanoseconds. Greater or smaller values of X may be used in other embodiments.

The times tB and tB' may be followed by a time tC, which represents the time it takes for the I/O circuit to serialize the output data as bursts of data which are provided on the DQ terminals and received by an external device such as a controller. Similar to the time tA, the time tC may be the same in both the first and second regions, as the operations which occur during the time tC may not be dependent on the distance to the DQ pads. Accordingly, an example read operation in the first region may take place between the initial time t0 and a first time t1 (where t1 is tA+tB+tC) and an example read operation in the second region may take place between the initial time t0 and a second time t2 (where t2 is tA+tB'+tC). The time t2 may be sooner than the time t1 (e.g, by X ns).

The controller may issue a read command to the memory device at the initial time t0, and then receive data from the data terminals of the memory device a time later. The time the controller waits before receiving the read data at the data terminals may be measured in a number of clock cycles. As may be seen in the graph 500, the time between t0 and t1 is a first number of clock cycles, while the time between t0 and t2 is a second number of clock cycles which is less than the first number. Accordingly, the controller may identify whether it is issuing a read command to the first region or the second region. The controller may identify the region based on the row and/or column address issued along with the read command. When the controller issues a read command to one or more memory cells of the first region, it may retrieve the data from the data terminals after the first number of clock cycles. When the controller issues a read command to one or more memory cells of the second region, the controller may retrieve data from the data terminals after a second number of clock cycles. Accordingly, the controller may operate the memory with variable timing based on the row and/or column address provided along with the read command.

Figure 6:
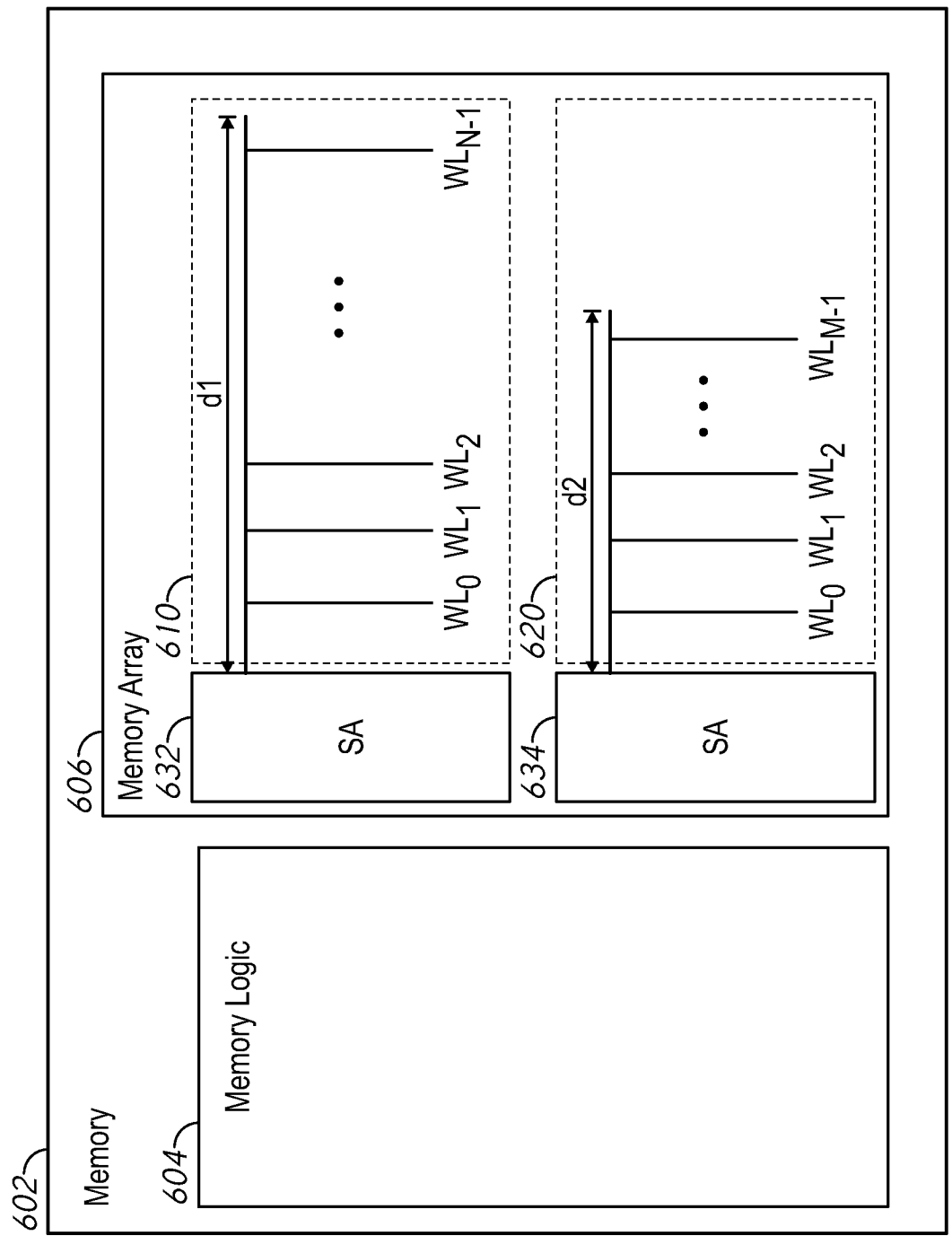
FIG. 6 is a block diagram of a memory system with different performance regions with different lengths of digit line according to some embodiments of the present disclosure.

FIG. 6 is a block diagram of a memory system with different performance regions with different lengths of digit line according to some embodiments of the present disclosure. The memory 602 may, in some embodiments, be included in the memory 202 of FIG. 2. For the sake of brevity, features and operations described with respect to FIG. 2 will not be repeated with respect to FIG. 6. In the memory 602, the first region 610 may include digit lines which are a first length d1 while the second region 620 may include digit lines which are a second length d2 which is shorter than d1.

The digit lines DL may be coupled to different numbers of word lines WL in the two regions. The digit line DL1 in the first region 610 may have N word lines (numbered $WL_0$ to $WL_{N-1}$) while the digit line DL2 in the second region 620 may have M word lines (numbered $WL_0$ to $WL_{M-1}$), where M is less than N. In some example embodiments N may be 1.5 k rows, while M is 512 rows. Other numbers of rows and ratios of rows between the regions may be used in other example embodiments. In some embodiments, the first and second regions 610 and 620 may have a same density of wordlines along the digit lines. Although only a single digit line each is shown in the first and the second region 610 and 620, it should be understood that the first and second regions 610 and 620 may each include a number of different digit lines. For example, the first region 610 may have J digit lines (e.g., DL0 to DLJ−1) for a total of N*J memory cells, and the second region 620 may have K digit lines (e.g., DL0 to DLK−1) for a total of M*K memory cells. In some embodiments, each of the wordlines of the first region 610 may have the length d1, while each of the wordlines of the second region 620 may have the length d2.

The reduced length of the digit line may offer a number of potential performance characteristic improvements in the second region 620 compared to the first region 610. For example, the second region 620 may have an increased speed of operation due to the reduced maximum length that signals need to travel along the digit lines. For example, the second region 620 may have an increased data fidelity due to an improved signal margin of signal strength to noise level along the digit line, which may be due, in part, to the reduced capacitance of the shorter digit lines. For example, the second region 620 may have reduced power consumption since the power required to charge the digit line as part of an access operation may be based on the capacitance of the digit line.

Figure 7:
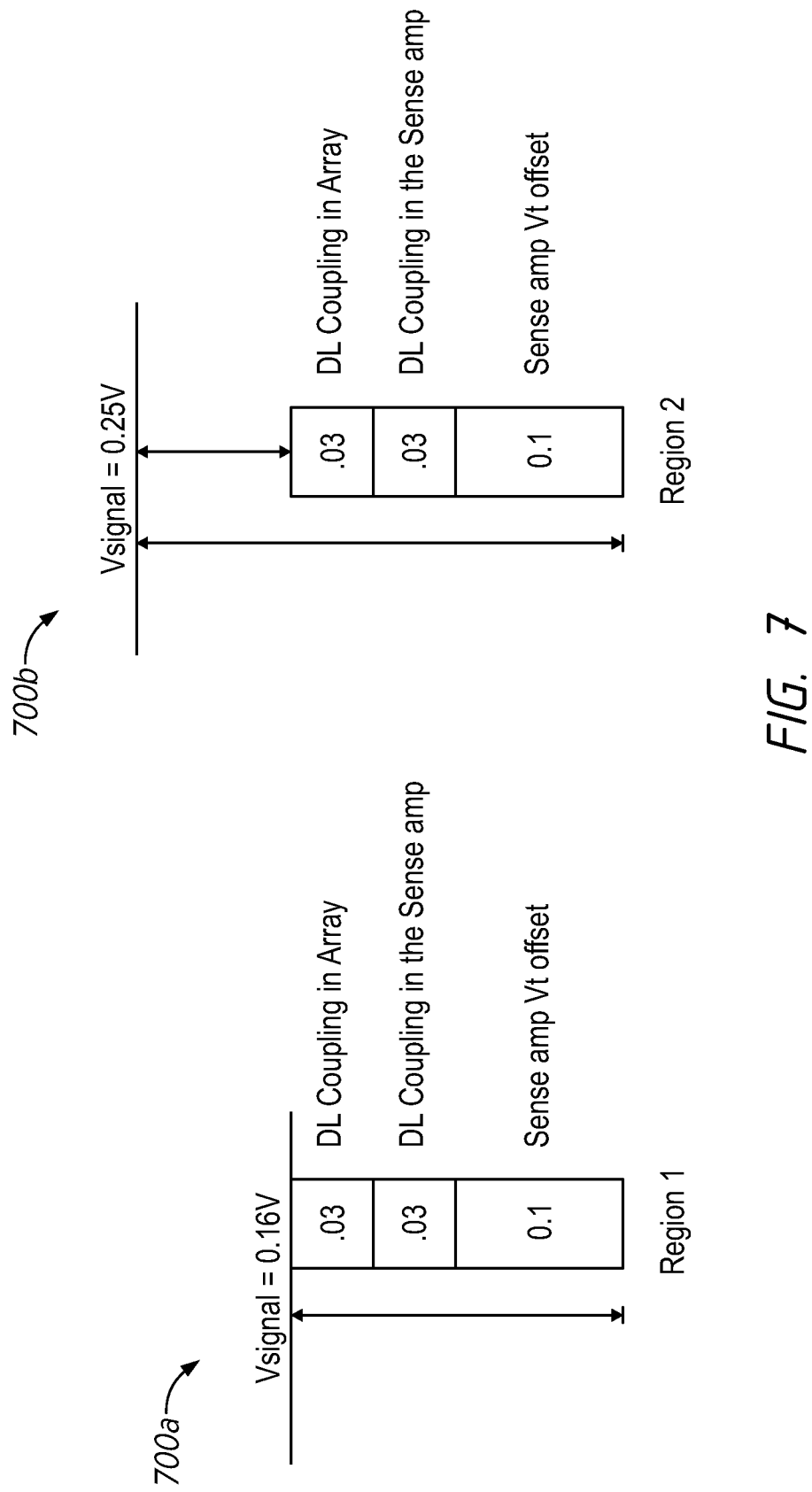
FIG. 7 is a graph of signal to noise margin in a first memory performance region and a second memory performance region according to some embodiments of the present disclosure.

FIG. 7 is a graph of signal to noise margin in a first memory performance region and a second memory performance region according to some embodiments of the present disclosure. The graph 700a shows a representation of noise voltages compared to a signal voltage Vsignal in a first region, while the graph 700b shows a representation of noise voltages compared to a signal voltage Vsignal in a second region. The first region may represent a region of a memory with longer digit line lengths than the second region. The first region and second region may, in some embodiments, be the first and second region 610 and 620 of FIG. 6. The graphs 700a and 700b of FIG. 7 show example values for noise and Vsignal voltages. These should be understood as example values for purposes of explanation only. Other example embodiments may have different voltages.

The graphs 700a and 700b show voltage along a vertical axis. The boxes represent sources of noise, each of which may have a different expected magnitude. For example the first box shows sense amplifier threshold voltage (Vt) offset, which may be a source of noise dependent on the structure and operation of the sense amplifiers. In some example embodiments, the Vt offset noise may be about 0.1 V. The second box shows digit line coupling in the sense amplifier as a potential source of noise, which may be, for example, about 0.03 V. The third box shows digit line coupling in the memory array, which may be, for example, about 0.03V. Since these sources of noise may generally be additive, the overall noise may be about 0.16V in this example. Accordingly, in order to be detected above the noise, the signal along the digit line (Vsignal) may need to be at least the magnitude of the voltage of the noise. The greater the signal margin (e.g., Vsignal−Vnoise), the more reliably the state of the signal may be detected. Vsignal may be given by equation 1, below:

$$V_{signal} = V_{final} - V_{digit} = \left(\frac{V_{cell} * C_{Cell} + V_{digit} * C_{digit}}{C_{Cell} + C_{digit}}\right) - V_{digit} \qquad \text{Eqn. 1}$$

In equation 1, Vfinal is the final voltage of the digit line when a signal is dumped onto the digit line by the cell, Vdigit is the initial voltage of the digit line, Vcell is the voltage of the memory cell coupled to the digit line, Ccell is the capacitance of the memory cell, and Cdigit is the capacitance of the digit line. For example, in a first region of the memory, Ccell=10 fF, Vcell=1V, Cdigit=20 fF, Vdigit=0.5V, then Vsignal=0.16V. Since Cdigit may generally scale with the length of the digit line, then if the second region has digit lines which are half the length of the first region, then the Cdigit of the second region may be reduced by half (e.g., to 10 fF in this example). Accordingly, the second region may have a Vsignal of 0.25V. Other differences in digit line length and Vsignal level may be used in other examples.

Thus, the second region may have a higher signal margin than the first region, since the level of noise is relatively unaffected by the length of the digit lines. The increased signal margin may cause the value of Vsignal to be more reliably detected in the second region than it is in the first region. Accordingly, the value of a bit read off a memory cell may be more accurately conveyed along the digit line than it is in the first region. This may reduce the failure rate in the second region compared to the first region.

Figure 8:
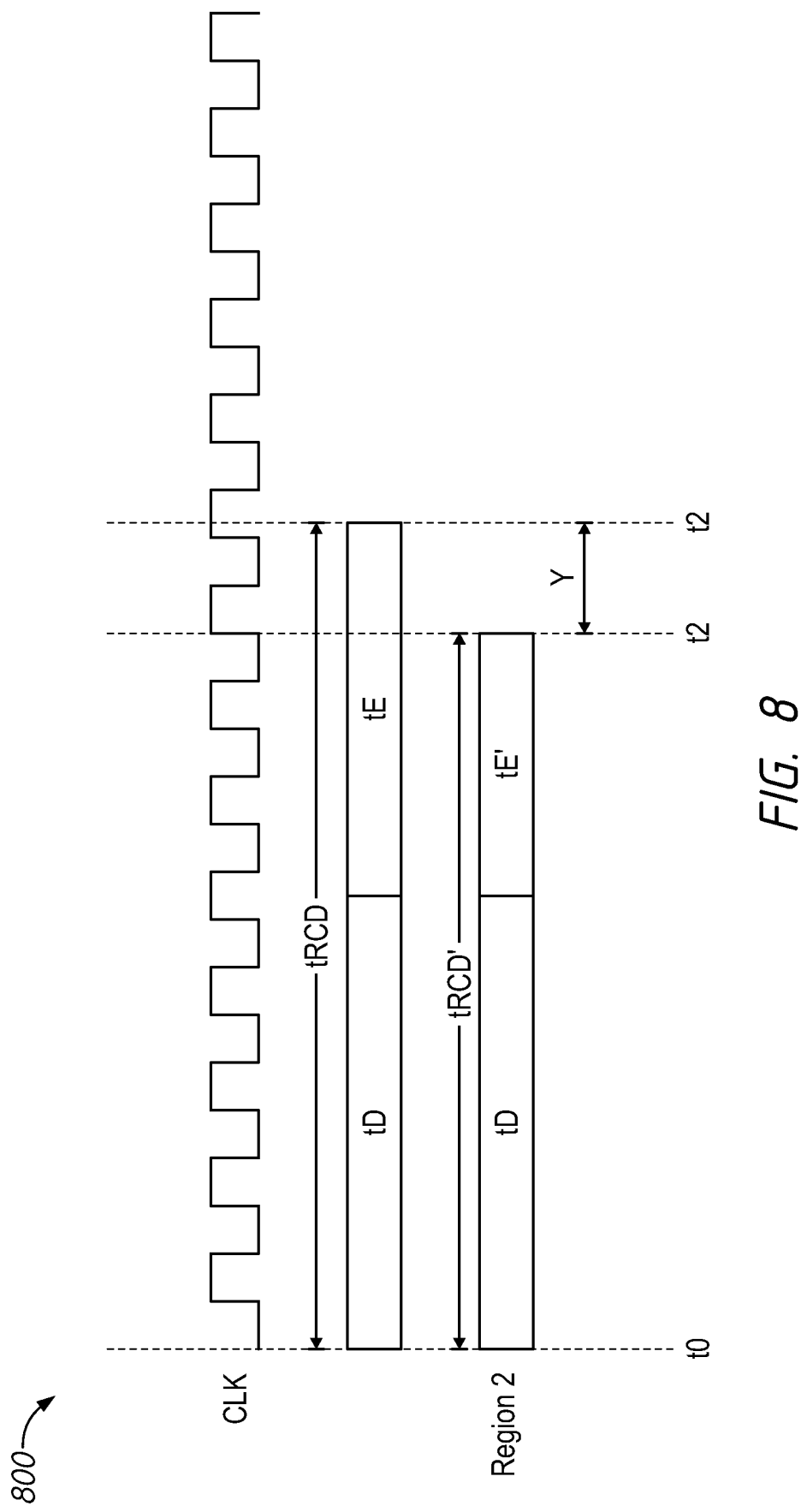
FIG. 8 is a timing diagram comparing example read operations in a memory with a first and a second performance region according to some embodiments of the present disclosure.

FIG. 8 is a timing diagram comparing example read operations in a memory with a first and a second performance region according to some embodiments of the present disclosure. The timing diagram 800 may generally be similar to the timing diagram 500 of FIG. 5. For the sake of brevity, features previously described with respect to FIG. 5 will not be repeated again with respect to FIG. 8. FIG. 8 shows the operation of a memory which has a first memory region with a first digit line length and a second memory region with a second digit line length shorter than the first length. FIG. 8 may, in some embodiments, represent the operation of a memory such as the memory 600 of FIG. 6.

At an initial time t0, the memory may receive a read command along with row and column addresses which indicate either memory cells of the first region or the second region. The time tD may represent the time it takes for an ACTIVE command (e.g., ACT) to be provided to the wordline specified by the row address, and the time it takes for that wordline to fire responsive to the ACTIVE command. The time tD may also represent the time it takes for digit lines to separate. The time tD may generally be the same in both the first and second region, since the time tD may not be strongly influenced by digit line length. The times tE and tE' may represent the time it takes for the word line to fire to an internal read command. The time tE' may be shorter than the time tE by Y nanoseconds. In some embodiments Y may be about 1-2 nanoseconds, although greater or smaller values of Y may be used in other examples. The times tD and tE form a time tRCD, and the times tD and tE' form a time tRCD'. The overall time tRCD' may be shorter than the overall time tRCD, and may be one or more clock cycles shorter.

After the time tRCD (or tRCD') the timing chart 800 may be followed by operations similar to those described in the timing chart 500 of FIG. 5. For example, after tRCD (or tRCD'), the timing tAA (or tAA') may begin as the memory responds to the internal read signal.

Figure 9:
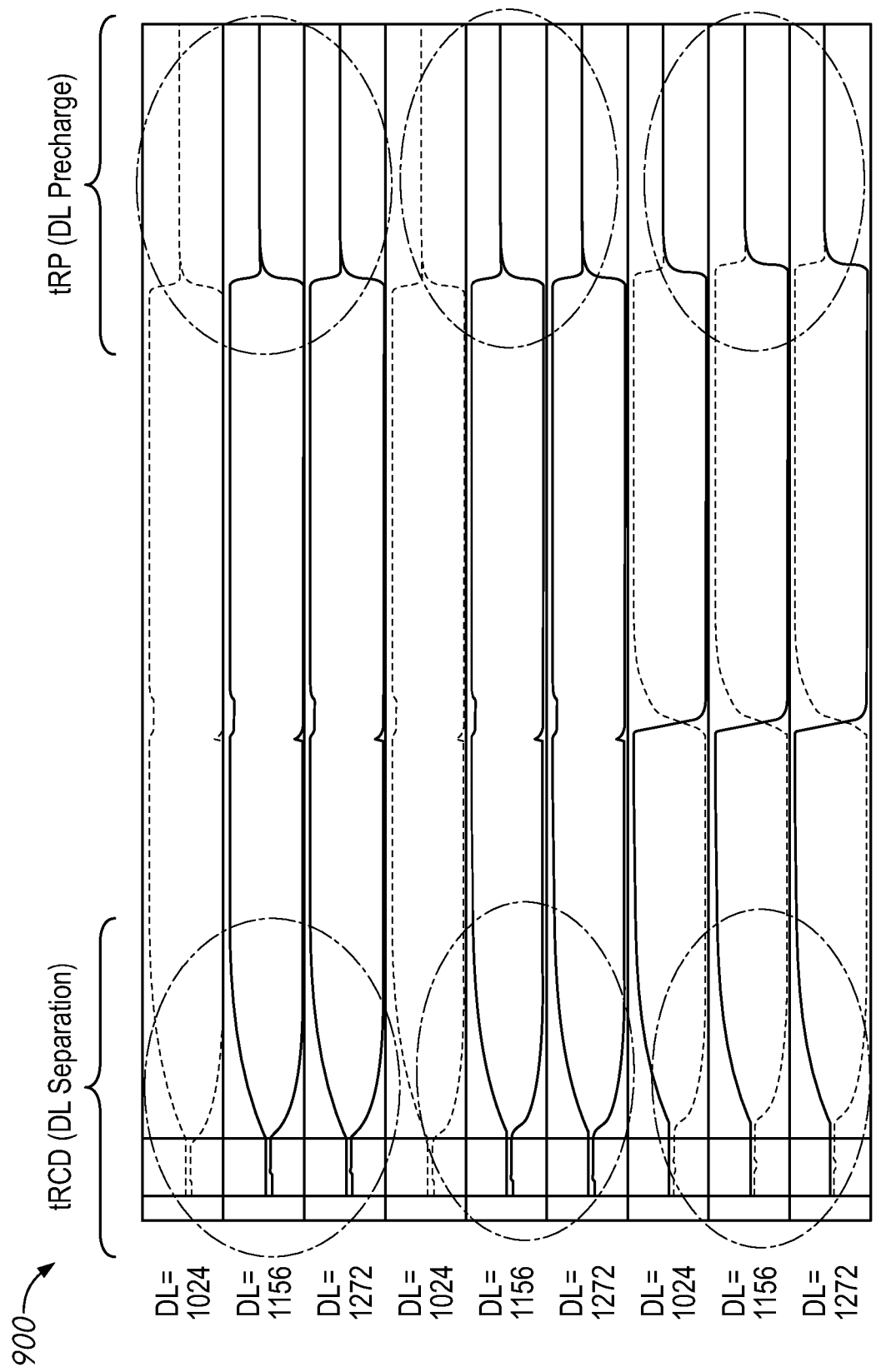
FIG. 9 is a graph 900 which shows various waveforms of memory regions with have different lengths of digit line according to some embodiments of the present disclosure.

FIG. 9 is a graph 900 which shows various waveforms of memory regions with have different lengths of digit line according to some embodiments of the present disclosure. The graph 900 shows simulations of voltages on a pair of digit lines for each of three different lengths of digit line (e.g., a memory with three different performance regions). The example digit line lengths are expressed as the number of word lines along that digit line. In the example of FIG. 9, the first digit line is 1024 word lines long, the second digit line is 1156 word lines long and the third digit line is 1272 word lines long.

The circled regions of the graphs show that there are different performance characteristics based on the length of the digit lines. For example, the first set of circled regions shows the time tRCD, which includes digit line separation. The shorter digit lines may separate sooner than the longer digit lines. The second set of circled regions shows the time tRP, which includes digit line pre-charging. In a similar manner, the shorter digit lines may pre-charge with quicker timing than the longer digit lines. Table 1 shows simulated differences between the digit lines at different lengths, expressed as the amount of time it takes them longer than the shortest digit line to perform tRCD or tRP.

| Digit Line Length | Delta tRCD (ns) | Delta tRP (ns) |
| --- | --- | --- |
| 1272 | 0.264 | 1.304 |
| 1156 | 0.246 | 0.831 |
| 1024 | 0 | 0 |

Figure 10:
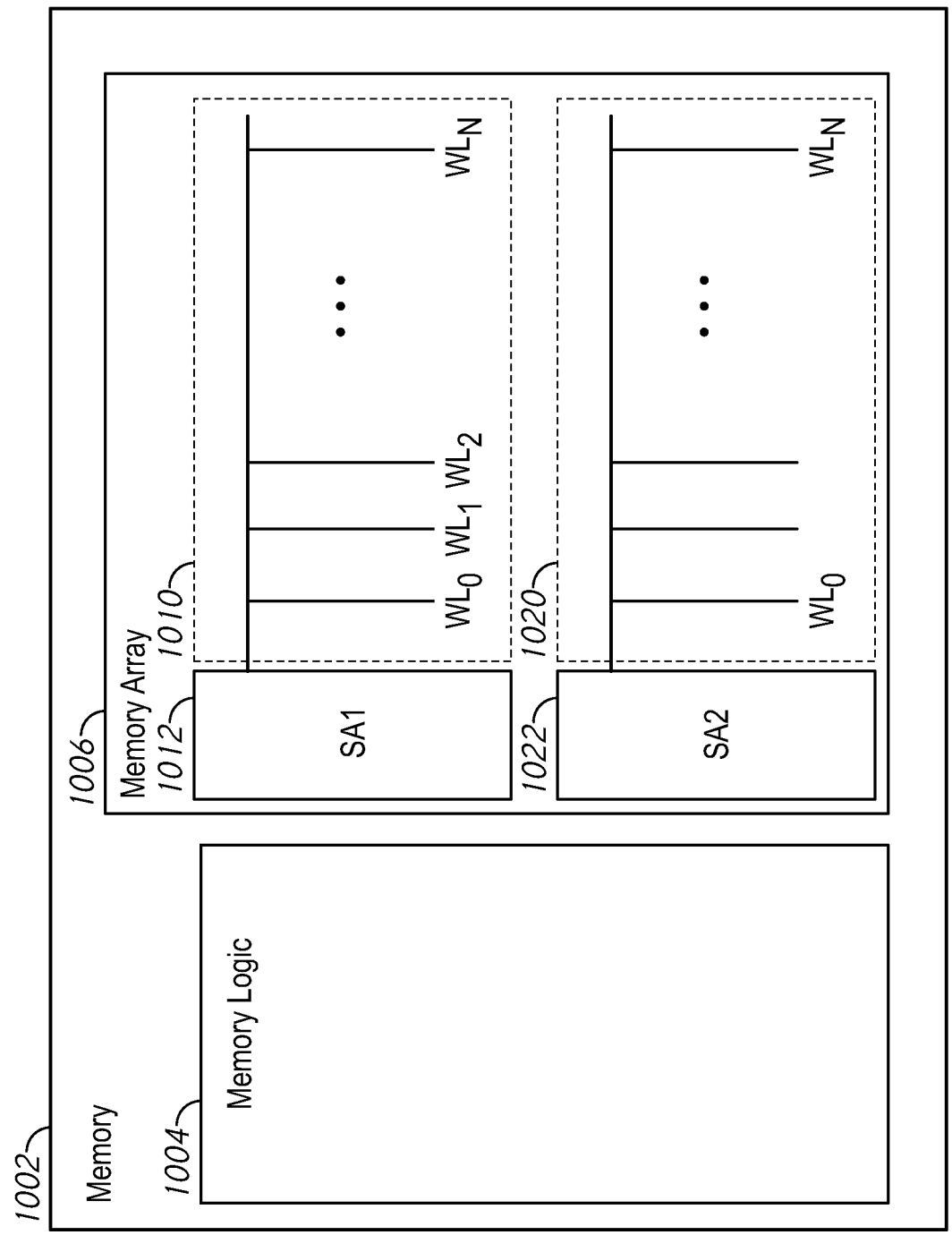
FIG. 10 is a block diagram of a memory array which uses different sense amplifier types in different regions of the memory array according to some embodiments of the present disclosure.

FIG. 10 is a block diagram of a memory array which uses different sense amplifier types in different regions of the memory array according to some embodiments of the present disclosure. The memory 1002 may, in some embodiments, be included in the memory 202 of FIG. 2. Since the memory 1002 may generally be similar to the memories 202 of FIG. 2, 302 of FIG. 3, and/or 602 of FIG. 6, features and components described with respect to those figures will not be repeated again with respect to FIG. 10.

In the example memory 1002 of FIG. 10, the first performance region 1010 may include digit lines which are coupled to a first type of sense amplifier 1012, while the second performance region 1020 may include digit lines which are coupled to a second type of sense amplifier 1022.

The first type of sense amplifier 1012 and the second type of sense amplifier 1022 may have different performance characteristics from each other, which may in turn lead to different performance characteristics for the memory regions 1010 and 1020. For example, the different types of sense amplifier 1012/1022 may have different levels of accuracy, space, and/or power consumption from each other. In some example embodiments, there may be a trade-off between sense amplifier types used. For example, the first type of sense amplifier 1012 may have reduced accuracy compared to the second type of sense amplifier 1022, however the first type of sense amplifier 1012 may also have lower power consumption and lower layout requirements than the second type of sense amplifier. In some embodiments, the second type of sense amplifier 1022 may be a voltage threshold compensating (VTC) sense amplifier, while the first type of sense amplifier 1012 is a non-VTC sense amplifier.

FIGS. 11A-11B are schematic diagrams of sense amplifiers according to some embodiments of the present disclosure. FIG. 11A shows a sense amplifier 1100a, and FIG. 11B shows a VTC sense amplifier 1100b. The sense amplifiers 1100a and 1100b may, in some embodiments, be included in the sense amplifiers 1012 and 1022 of FIG. 10. For example, the sense amplifier 1100a may be used as the sense amplifier 1012 of FIG. 10 and the sense amplifier 1100b may be used as the sense amplifier 1022.

The sense amplifiers 1100a and 1100b are coupled to bit lines (or digit lines) BLT and BLB, which, when activated as part of a read operation have a change in potential based on a logical level stored in a memory cell at the intersection of the bit line and an activated word line. Before a read operation, a bit line equalization signal BLEQ may be used to charge both bit lines to a voltage $V_{EQ}$. As part of a read operation, one of the bit lines may experience a change in voltage based on the signal read from the coupled memory cell, and the sense amplifier may then change the potential of the bit lines BLT and BLB based on the change in potential from the memory cell. For example, the sense amplifiers 1100a and 1100b may raise the bit line to a first voltage SAP, such as a system voltage (e.g., Vdd) to represent a high logical level, while a second voltage SAN, such as a ground voltage (e.g., Vss) may represent a low logical level. The sense amplifiers 1100a and 1100b may change the voltages of the bit lines in opposite directions. For example, if the bit line BLT is coupled to the memory cell, and the memory cell stores a high logical level, then the bit line BLT may be driven to the first voltage SAP (e.g., Vdd), while the second bit line BLB is driven to the second voltage SAN (e.g., Vss). The voltage $V_{EQ}$ may, in some embodiments, be an average of SAP and SAN (e.g., half of Vdd).

The amplifier 1100a includes four transistors, 1105-1120 which act to sense and amplify the voltage on the bit lines BLT and BLB, and a pre-charge circuit 1130 to pre-charge the bit lines BLT and BLB to the voltage $V_{EQ}$. The pre-charge circuit 1130 includes three transistors all of which have gates coupled to the signal BLEQ. In an embodiment where BLEQ is active at a high voltage (e.g., Vdd), the transistors of the pre-charge circuit 1130 may be n-type transistors, with the voltage $V_{EQ}$ coupled between a drain and source of a pair of transistors in series, and an additional transistor with a source coupled to a drain of the transistor with its source coupled to $V_{EQ}$, and a drain coupled to the source of the transistor with its drain coupled to $V_{EQ}$.

The transistor 1105 has a source coupled to the voltage SAP a drain coupled to the bit line BLB and a gate coupled to the bit line BLT. The transistor 1110 has a source coupled to the voltage SAP, a drain coupled to the bit line BLT and a gate coupled to the bit line BLB. The transistors 1105 and 1110 may be p-type transistors. The transistor 1115 has a source coupled to SAN, a drain coupled to BLB and a gate coupled to BLT. The transistor 1120 has a source coupled to SAN, a drain coupled to BLT, and a gate coupled to BLB. The transistors 1115 and 1120 may be n-type transistors. Accordingly, when the voltage on BLT is greater than the voltage on BLB (e.g., due to a memory cell coupled to BLT storing a high logical level), the transistors 1110 and 1115 may be active to drive the potentials of BLT to SAP and BLB to SAN. When the voltage on BLT is lower than the voltage on BLB (e.g., due to a memory cell coupled to BLT storing a low logical level) then the transistors 1105 and 1120 may activate to drive the voltage of BLT to SAN and the voltage of BLB to SAP.

The amplifier 1100b may generally be similar to the amplifier 1110a, but may include additional features (such as additional transistors) to make the amplifier 1100b less sensitive to error, such as error due to threshold voltage mismatch between the transistors 1105-1120. For the sake of brevity, features and operations previously described with respect to the amplifier 1100a will not be repeated with respect to the amplifier 1100b. The amplifier 1100b includes additional signals ISO and OC, and additional transistors 1145-1160 which work together to isolate the pairs of transistors 1105/1110 and 1115/1120 during different parts of the sensing operation. The transistor 1145 has a gate coupled to ISO, a source coupled to BLB and a drain coupled to a node SA_BLB, which is coupled between the drain of the transistor 1110 and the drain of the transistor 1120. The transistor 1150 has a gate coupled to ISO, a source coupled to BLT, and a drain coupled to a node SA_BLT coupled between the drains of the transistors 1105 and 1115. The transistor 1155 has a gate coupled to OC, a source coupled to BLB and a drain coupled to SA_BLT. The transistor 1160 has a gate coupled to OC, a source coupled to BLT, and a drain coupled to SA_BLB. The transistors 1145 to 1160 may, in some embodiments, be n-type transistors.

During a read operation, the signal BLEQ may be driven to a low logical level (after pre-charging the bit lines to $V_{EQ}$) and the signal ISO may also be driven to a low logical level to inactivate the transistors 1145 and 1150. The signal OC may initially remain at a high level to keep the transistors 1155 and 1160 active. This may separate the bit line BLT from SA_BLT (as well as separating BLB from SA_BLB) while keeping BLT coupled to SA_BLB (and BLB to SA_BLT). When the word line activates, the voltage OC may also change to a low level to inactivate the transistors 1155 and 1160. The signal BLEQ may also be briefly raised to an active level to charge the nodes SA_BLT and SA_BLB.

The amplifier 1100b may be less sensitive to voltage threshold errors than the amplifier 1100a. However, the amplifier 1100b may take up more space and more power than the amplifier 1100a (e.g., due in part to the added signals OC and ISO and the added transistors 1145 to 1160). Accordingly, while the amplifier 1100b may be useful in situations where smaller voltage changes are expected on the bit lines when the memory cell is read, while the amplifier 1100a may be useful in situations where the voltage change from the memory cell is more clear, but reduced power and space is desired.

Figure 12:
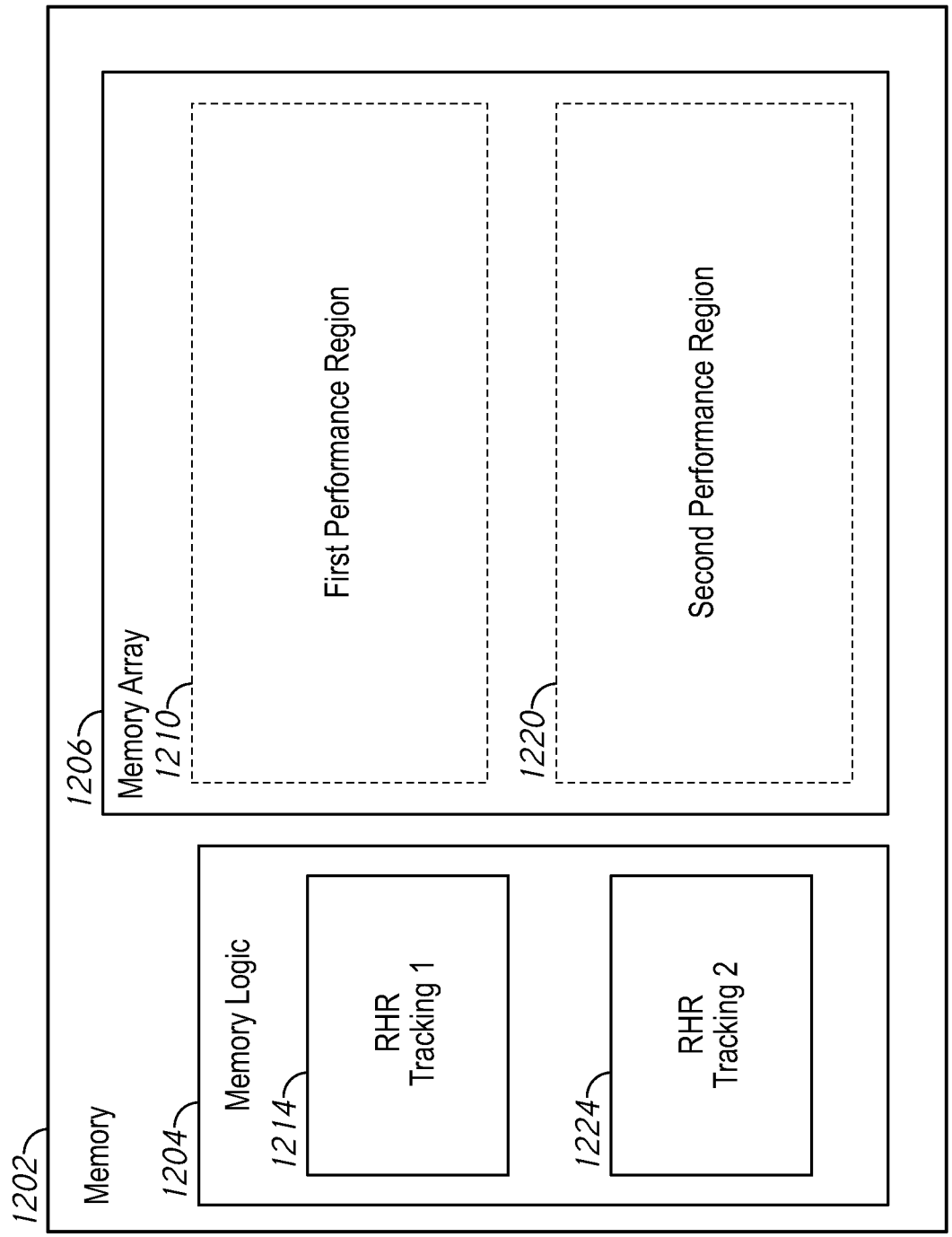
FIG. 12 is a block diagram of a memory with a different RHR tracking circuits according to some embodiments of the present disclosure.

FIG. 12 is a block diagram of a memory with a different RHR tracking circuits according to some embodiments of the present disclosure. The memory 1202 includes a first memory region 1210 which is coupled to a first RHR tracking circuit 1214 and a second memory region 1220 which is coupled to a second RHR tracking circuit 1224. The memory 1202 may, in some embodiments, be included in the memory 202 of FIG. 2. Since the memory 1202 may generally be similar to memories 202 of FIG. 2, 302 of FIG. 3, 602 of FIG. 6, and/or 1002 of FIG. 10, for the sake of brevity features and components described with respect to those figures will not be repeated again with respect to FIG. 12.

The first RHR tracking circuit 1214 may track accesses to the first performance region 1210. The second RHR tracking circuit 1224 may track accesses to the second performance region 1220. Each of the RHR tracking circuits 1214 and 1224 may monitor a pattern of accesses to the memory cells in their respective memory regions, and may determine if and/or which rows warrant a targeted refresh. For example, the RHR tracking circuits 1214 and 1224 may determine if a row is being accessed above a certain rate (or above a certain number of times), and may identify that row as a potential aggressor row, such that the victims of that potential aggressor row may be refreshed as part of a targeted refresh operation. In some embodiments, the RHR tracking circuits 1214 and 1224 may identify the row which is accessed the most and may identify it as a potential aggressor row.

The first RHR tracking circuit 1214 and the second RHR tracking circuit 1224 may have different performance characteristics, which may in turn lead to different performance characteristics in the first region 1210 and the second region 1220. The second RHR tracking circuit 1224 may store and monitor more row accesses in order to locate aggressor rows than the first RHR tracking circuit 1214. For example, an RHR tracking circuit may receive row addresses associated with access operations, and may save some or all of the received row addresses. The more row addresses that the RHR tracking circuit is capable of storing, the more accurately the RHR tracking circuit can monitor for aggressor rows, however the more space and power may be required by the RHR tracking circuit. In some example embodiments, the first RHR tracking circuit 1214 may store less received addresses than the second RHR tracking circuit 1224. This may lead to the information stored in the second performance region 1220 being better protected against the row hammer phenomenon than information in the first performance region 1210.

Figure 13:
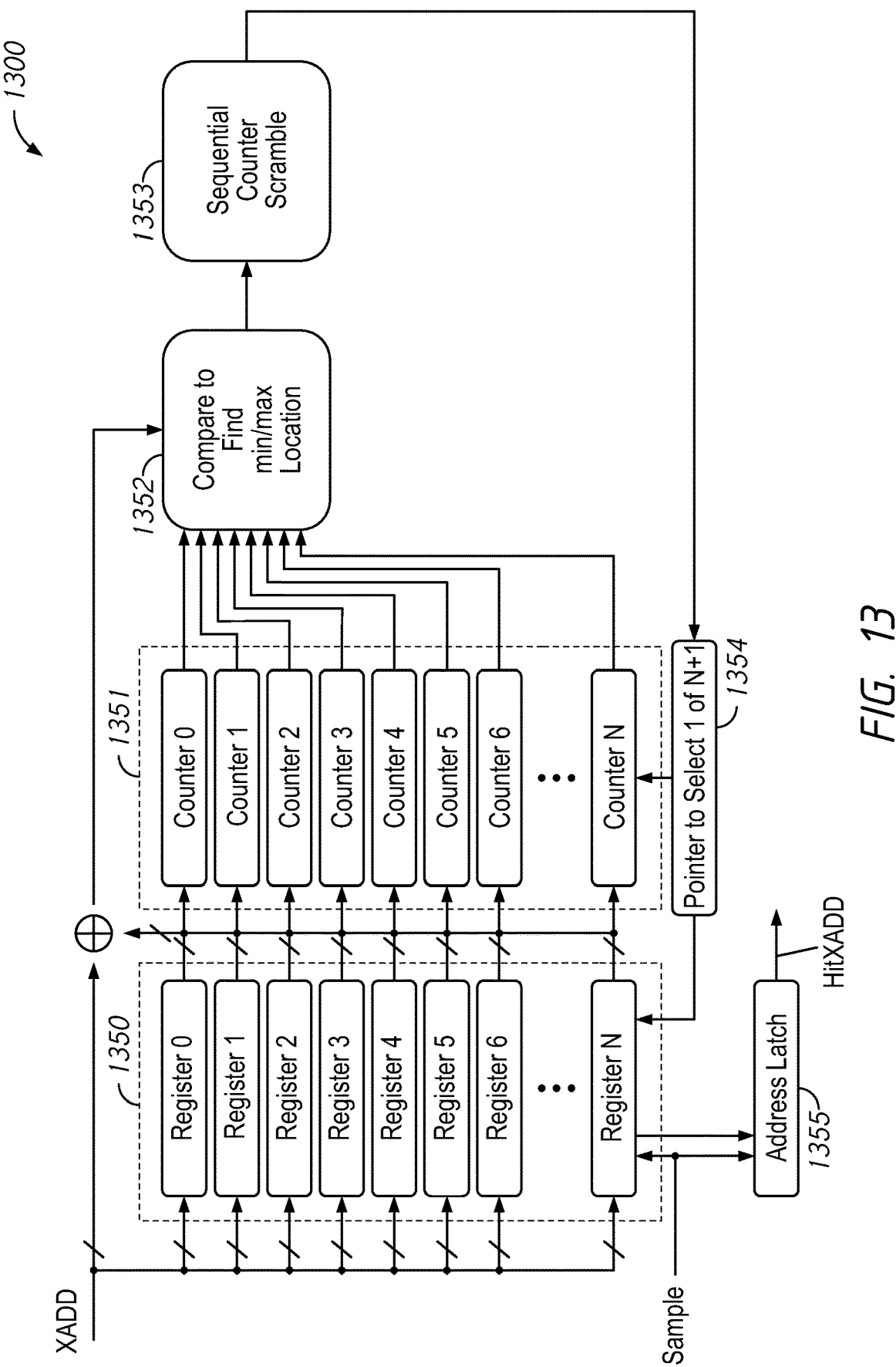
FIG. 13 is a block diagram of an aggressor detector circuit according to an embodiment of the present disclosure.

FIG. 13 is a block diagram of an aggressor detector circuit according to an embodiment of the present disclosure. In some embodiments, the aggressor detector circuit 1300 may be included in refresh control circuit 116 of FIGS. 1 and/or 1214/1224 of FIG. 12. The particular embodiment of the aggressor detector circuit 1300 may be a content addressable memory (CAM) and counter aggressor detector circuit. The aggressor detector circuit 1300 may include a series of registers 1350, each of which may have a corresponding counter 1351. The counters 1351 may be coupled to a comparator 1352 which may be coupled to a pointer 1354 through a counter scrambler 1353. The registers 1350 may be coupled to an address latch 1355, which may store and provide an identified row hammer address as the match address HitXADD.

The aggressor detector circuit 1300 may sample a current row address XADD responsive to the sample signal Sample. The sample signal Sample may also cause the aggressor detector circuit 1300 to determine if a sampled address (e.g., an address stored in one of the registers 1350) is a row hammer address and store it on the address latch 1355, where it can be provided to a refresh address generator as the match address HitXADD.

Each time the sample signal Sample is provided, the current row address XADD may be compared to the registers 1350. If the current address XADD is already stored in one of the registers, then the counter 1351 associated with that register 1350 may be incremented. If the current address XADD is not already stored in one of the registers 1350, it may be added to the registers 1350. If there is an open register (e.g., a register without a latched address) then the sampled address XADD may be stored in the open register. If there is not an open register, then the register associated with the counter 1351 which has the lowest value (as indicated by the pointer 1354) may have its latched address replaced with the sampled address XADD.

The Sample signal may also cause the comparator 1352 to determine a counter 1351 with a maximum and minimum value. The pointer 1354 may point to the register 1350 associated with the maximum value of count in the counters 1351 and may point to the register 1350 associated with the minimum value of count in the counters 1351. The minimum pointer may be used to overwrite a register 1350 when a new address XADD is sampled and there is no open register 1350 to store it in. The signal Sample may cause the address stored in the register 1350 indicated by the maximum pointer to be stored in the address latch 1355.

The address stored in the address latch 1355 may be provided as the match address HitXADD. When a targeted refresh operation is carried out based on the address HitXADD, (e.g., when victim addresses associated with HitXADD are refreshed), the counter 1351 associated with the refresh operation may be reset.

In some embodiments, an optional counter scrambler 1353 may be used to vary the behavior the aggressor detector circuit 1300 so that other addresses besides the one associated with the maximum pointer are provided as the match address HitXADD. In an example operation, the counter scrambler 1353 may be activated every other time that an address needs to be provided as the address HitXADD. When the counter scrambler 1353 is active, it may cause an address based on a sequence of the registers to be provided as the address HitXADD instead of the address associated with the maximum pointer. Thus for example, the addresses may be provided in a sequence such as: maximum pointer, register 0; maximum pointer; register 2; maximum pointer, register 1; etc. Other patterns of addresses, and other patterns of activating the address scrambler 1353 (e.g., every third refresh, etc.) may be used in other example embodiments.

In some embodiments, a first region of the memory (e.g., 1210 of FIG. 12) may be coupled to an aggressor detector circuit 1300 with a first number of registers 1350 and counters 1351 (e.g, Register 0 to Register N1), while a second region of the memory (e.g., 1220 of FIG. 12) may be coupled to an aggressor detector circuit 1300 with a second number of registers 1350 and 1351 (e.g., Register 0 to Register N2). The second number N2 may be greater than the first number N1. In this manner, an aggressor detector circuit 1300 with the increased number of registers and counters (e.g., N2) may more reliably track row hammer events than the aggressor detector circuit 1300 with less registers and counters (e.g., N1).

In some embodiments, the first region of the memory (e.g., 1210 of FIG. 12) may include a sample signal, while the second region of the memory (e.g., 1220 of FIG. 12) may omit the sample signal. In an embodiment where the sample signal is omitted, the registers 1350 may receive each address XADD provided along the address bus. In some embodiments, one of the aggressor detector circuits may omit the sample signal, and also have a different number of registers than the other aggressor detector circuit. For example, an aggressor detector circuit 1300 associated with the second region (e.g., 1220 of FIG. 12) may omit the sample signal and also have more registers than an aggressor detector circuit associated with the first region (e.g., 1210 of FIG. 12). In some embodiments, the aggressor detector circuit associated with the second region (e.g., 1220 of FIG. 12) may have a number of registers and counters to track all of the word lines in that region, while the aggressor detector circuit associated with the first region (e.g., 1210 of FIG. 12) may have less registers/counters than the number of word lines in that region.

In some embodiments, a memory may include a first region and a second region with different performance characteristics which are due to combinations of the factors such as the factors discussed in FIGS. 3-12. Any of the example methods of differentiating the two performance regions described herein may be combined together.

For example, a memory may include a second region which is defined based on its proximity to the DQ pads (e.g., similar to FIGS. 3-5) and which also includes digit lines which are shorter than digit lines outside the second region (e.g., similar to FIG. 6-8). The second region may have decreased latency compared to the first region, since both the reduced distance and the reduced length of the digit lines may improve the speed at which data is read out along the digit lines. Accordingly, a memory controller coupled to the memory may provide a read command to the second region and retrieve data after fewer clock cycles than when a read command is issued to the first region.

For example, a memory may include a first region with digit lines of a first length and a second region with digit lines of a second length (e.g., similar to FIGS. 6-8) and also may have different RHR detection logic in the first region than in the second region (e.g., similar to FIGS. 11-12). This combination may offer a synergistic benefit, as the second region may include less word lines than the first region (e.g., due to the reduced length of the digit lines). Accordingly, it may be possible to identify and track accesses to more wordlines in the second region. In some embodiments, the RHR logic in the second region may be able to track accesses to every word line of the second region, due to the reduced number of word lines, while the RHR logic of the first region may have to rely on tracking only a portion of the accesses (e.g., via sampling).

For example, a memory may have a first region with digit lines of a first length and a second region with digit lines of a second length (e.g., similar to FIGS. 6-9) and may have a first type of sense amplifier coupled to the digit lines of the first region and a second type of sense amplifier coupled to the digit lines of the second region (e.g., similar to FIGS. 10-11). For example, the digit lines of the second region may be shorter than the digit lines of the first region. This may cause the digit lines of the second region to have an increased signal to noise margin. Accordingly, the second region may use sense amplifiers which are more susceptible to noise but which offer benefits such as drawing less power and/or taking up less space than the sense amplifiers of the first region. For example, the sense amplifiers in the first region may be VTC sense amplifiers (e.g., similar to the sense amplifier of FIG. 11B), while the sense amplifiers of the second region may be non-VTC sense amplifiers (e.g., similar to the sense amplifiers of FIG. 11A).

For example, a memory may have a first region with digit lines of a first length and a second region with digit lines of a second length (e.g., similar to FIGS. 6-9) and the first region may be monitored by a first RHR tracking circuit while the second region may be monitored by a second RHR tracking circuit. Since the second region may include less word lines than the first region, it may be easier to track accesses to the second region than to the first region. In some embodiments, the second RHR tracking circuit may track all of the accesses to the second region, while the first RHR tracking circuit may track less than all of the accesses (e.g., by sampling).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a memory array comprising a first plurality of memory cells in a first physical address space and a second plurality of memory cells in a second physical address space;
    a data bus coupled to the first and the second pluralities of memory cells via a plurality of word lines and one or more decoders;
    a first set of digit lines having a first length, the digit lines of the first set coupled to the memory cells of the first plurality and to one or more of the word lines,
    wherein the first set of digit lines are each coupled to a first sense amplifier of a first set of sense amplifiers,
    wherein the first set of sense amplifiers are only voltage threshold compensating (VTC) sense amplifiers, and
    wherein the VTC sense amplifiers comprise:
        a first set of transistors comprising first, second, third, and fourth transistors,
        wherein a first digit line of the first set of digit lines is coupled to a gate of the third transistor, and
        wherein a second digit line of the first set of digit lines is coupled to a gate of the fourth transistor; and
        a second set of transistors comprising fifth, sixth, seventh, and eighth transistors,
        wherein the first digit line is coupled to a source of the fifth transistor,
        wherein a drain of the fifth transistor is coupled to a node between a drain of the second transistor and a drain of the fourth transistor,
        wherein the second digit line is coupled to a source of the sixth transistor,
        wherein a drain of the sixth transistor is coupled to a node between a drain of the first transistor and a drain of the third transistor, and
        wherein a source of the seventh transistor is coupled to the first digit line, and wherein a source of the eighth transistor is coupled to the second digit line;
    a second set of digit lines having a second length that is shorter than the first length, the digit lines of the second set coupled to the memory cells of the second plurality, wherein the second set of digit lines are each coupled to a second sense amplifier of a second set of sense amplifiers, and wherein the second set of sense amplifiers are only non-VTC sense amplifiers;
    a plurality of interface connections coupled to the data bus, each connection couplable to a solder pad, wherein the first physical address space is located closer to the interface connections than the second physical address space; and
    a controller configured to determine respective performance characteristics associated with the first physical address space and the second physical address space.

2. The apparatus of claim 1, wherein the controller is configured to issue a first read command to a first address in the first physical address space and expect a first response to the first read command at a first time, wherein the controller is configured to issue a second read command to a second address in the second physical address space and expect a second response to the second read command at a second time, wherein the first time is a first number of clock cycles after the first read command, and wherein the second time is a second number of clock cycles after the second read command.

3. The apparatus of claim 1, wherein the first plurality of memory cells are within a first distance of the interface connections, and wherein the second plurality of memory cells are within a second distance of the plurality of interface connections which is different than the first distance.

4. The apparatus of claim 3, wherein the first distance and the second distance are passed on a number of rows, a number of columns, or a combination thereof.

5. An apparatus comprising:
    a memory array including a first plurality of memory cells in a first physical address space and a second plurality of memory cells in a second physical address space;
    one or more decoders configured to execute one or more access operations on the memory array responsive to command and address signals;
    a first digit line having a first length, the first digit line coupled to one or more memory cells of the first physical address space;
    a first sense amplifier coupled to the first digit line,
    wherein the first sense amplifier comprises only a voltage threshold compensating (VTC) sense amplifier, and
    wherein the VTC sense amplifier comprises:
        a first set of transistors comprising first, second, third, and fourth transistors,
        wherein a first digit line of the first set of digit lines is coupled to a gate of the third transistor, and
        wherein a second digit line of the first set of digit lines is coupled to a gate of the fourth transistor; and
        a second set of transistors comprising fifth, sixth, seventh, and eighth transistors,
        wherein the first digit line is coupled to a source of the fifth transistor,
        wherein a drain of the fifth transistor is coupled to a node between a drain of the second transistor and a drain of the fourth transistor,
        wherein the second digit line is coupled to a source of the sixth transistor,
        wherein a drain of the sixth transistor is coupled to a node between a drain of the first transistor and a drain of the third transistor, and wherein a source of the seventh transistor is coupled to the first digit line, and wherein a source of the eighth transistor is coupled to the second digit line;

a second digit line having a second length shorter than the first length, the second digit line coupled to one or more memory cells of the second physical address space;

a second sense amplifier coupled to the second digit line, wherein the second sense amplifier comprises only a non-VTC sense amplifier; and a controller configured to determine respective performance characteristics associated with the first physical address space and the second physical address space.

6. The apparatus of claim 5, wherein the first digit line is coupled to a first number of word lines of the memory array, and wherein the second digit line is coupled to a second number of word lines of the memory array, which is different from the first number.

7. The apparatus of claim 5, wherein the memory cells of the first physical address space are within a first distance of a data pad and wherein the memory cells of the second physical address space are within a second distance of the data pad which is different than the first distance.

8. The apparatus of claim 5, wherein the first sense amplifier is configured to receive a signal along the first digit line in a first time and wherein the second sense amplifier is configured to receive a signal along the second digit line in a second time which is different than the first time.

* * * * *